(12) United States Patent
Kumph et al.

(10) Patent No.: US 12,258,264 B2
(45) Date of Patent: Mar. 25, 2025

(54) MICROELECTROMECHANICAL SYSTEM (MEMS) INTERCONNECT INCLUDING SPRING BODY WITH AT LEAST TWO SPRING ARMS MICROMACHINED FROM SILICON SUBSTRATE

(71) Applicant: INTERNATIONAL BUSINESS MACHINES CORPORATION, Armonk, NY (US)

(72) Inventors: Muir Kumph, Croton on Hudson, NY (US); Vivekananda P. Adiga, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 446 days.

(21) Appl. No.: 17/805,436

(22) Filed: Jun. 3, 2022

(65) Prior Publication Data

US 2023/0391609 A1 Dec. 7, 2023

(51) Int. Cl.
*B81B 7/00* (2006.01)
*B81C 1/00* (2006.01)
*H10N 60/10* (2023.01)

(52) U.S. Cl.
CPC ........ *B81B 7/0006* (2013.01); *B81C 1/00626* (2013.01); *H10N 60/10* (2023.02); *B81B 2207/015* (2013.01)

(58) Field of Classification Search
CPC ........... B81B 7/0006; B81B 2207/015; B81B 2203/0109; B81B 2203/053; B81B 2203/056; B81C 1/00626; H10N 60/10; H01L 24/16
See application file for complete search history.

(56) References Cited

U.S. PATENT DOCUMENTS

| 5,973,394 | A | 10/1999 | Slocum et al. |
| 6,250,933 | B1 | 6/2001 | Khoury et al. |
| 6,262,463 | B1 | 7/2001 | Miu et al. |
| 6,556,737 | B1 | 4/2003 | Miu et al. |
| 9,187,313 | B2 | 11/2015 | Eskridge et al. |

(Continued)

FOREIGN PATENT DOCUMENTS

TW 202119658 B 9/2020

OTHER PUBLICATIONS

Spanier, G. et al., "Platform for Temporary Testing of Hybrid Microsystems at High Frequencies", Journal of Microelectromechanical Systems (2007), vol. 16:6, pp. 1367-1377.

(Continued)

*Primary Examiner* — Ermias T Woldegeorgis
(74) *Attorney, Agent, or Firm* — Intelletek Law Group, PLLC; Gabriel Daniel, Esq.

(57) ABSTRACT

A microelectromechanical system (MEMS) device and method of fabrication are provided. The MEMS devices includes a silicon substrate. The silicon substrate includes a top surface. An interconnect is machined from the silicon substrate. The interconnect includes at a spring body that has least two spring arms. Each spring arm includes a first end distal from a center of the interconnect, a second end proximate the center of the interconnect, and a single turn of a constant curvature. Each spring arm is configured to move rotationally in a plane parallel to the top surface of the silicon substrate.

20 Claims, 16 Drawing Sheets

(56) References Cited

U.S. PATENT DOCUMENTS

| | | |
|---|---|---|
| 10,319,896 B2 | 6/2019 | Falcon et al. |
| 10,734,696 B2 | 8/2020 | El Bouayadi et al. |
| 2013/0341735 A1* | 12/2013 | Eskridge .............. B81B 7/0051 438/455 |
| 2017/0213143 A1 | 7/2017 | Chow et al. |
| 2021/0005353 A1 | 1/2021 | Van Dyke |
| 2021/0343785 A1 | 11/2021 | Nakamura et al. |

OTHER PUBLICATIONS

Rosenberg, D. et al., "3D Integration and Packaging for Solid-State Qubits", ArXiv:1906.11146v2 (2019). 22 pgs.

International Search Report and Written Opinion issued Sep. 20, 2023 is related International Patent Application No. PCT/EP2023/064777, 11 pgs.

* cited by examiner

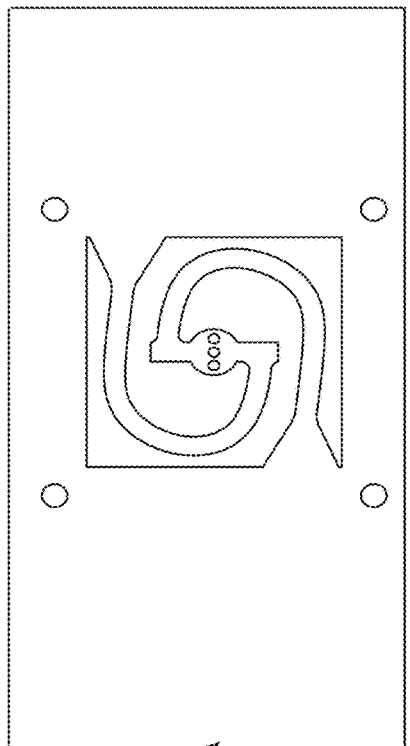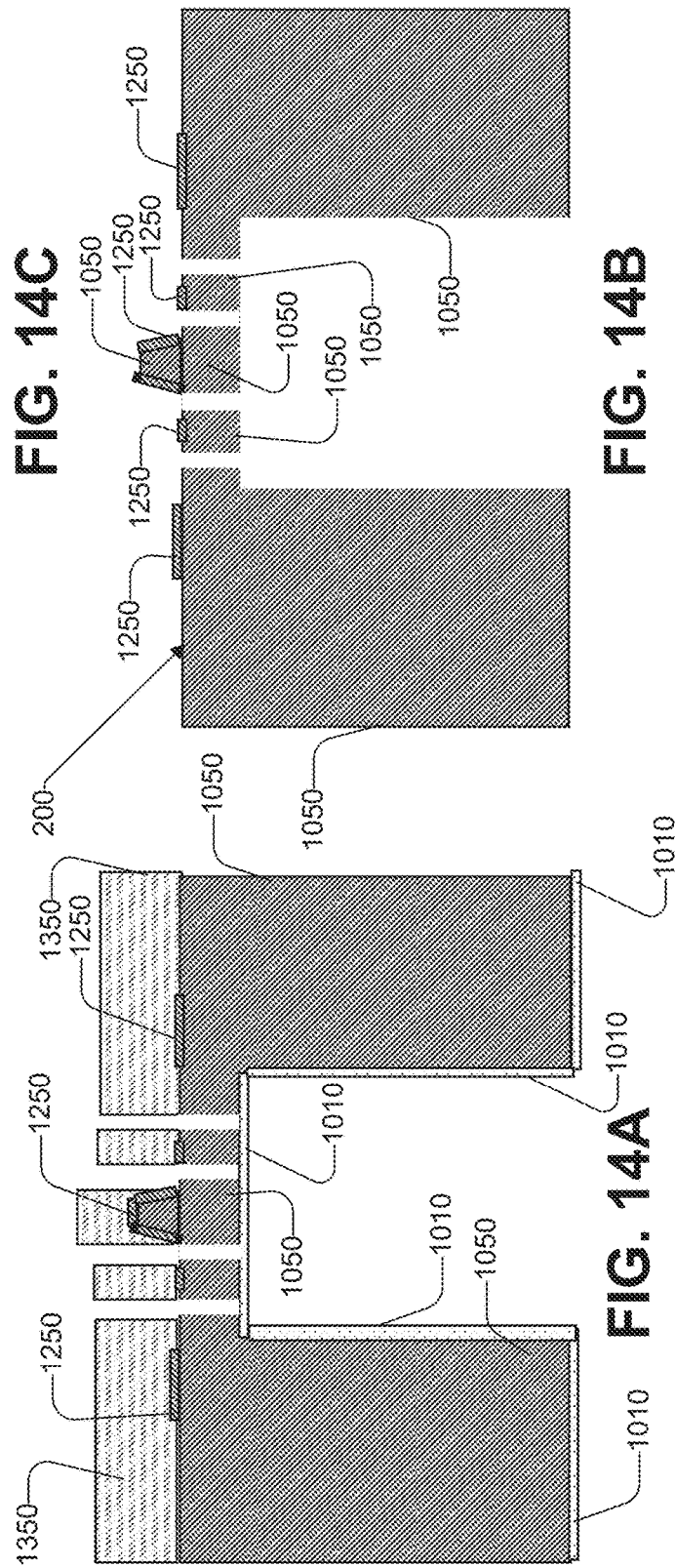

MICROELECTROMECHANICAL SYSTEM (MEMS) INTERCONNECT INCLUDING SPRING BODY WITH AT LEAST TWO SPRING ARMS MICROMACHINED FROM SILICON SUBSTRATE

BACKGROUND

Technical Field

The present disclosure generally relates to electrical devices, and more particularly, to a micromachined superconducting interconnect in silicon.

Description of the Related Art

The chips used for quantum computing need to make electrical connections to other chips and to the fridge wiring. Quantum computing chip connections are, ideally, reliable and able to be mated and de-mated many times.

The most common way to connect to or from a microchip is to use wire bonds. Some modern quantum processors use indium bumps. Wire bonds and indium bumps are permanent and can be frail or easily damaged, for example, during de-mating.

SUMMARY

According to an embodiment of the present disclosure, a microelectromechanical system (MEMS) device is provided. The MEMS device includes a silicon substrate. The silicon substrate includes a top surface. An interconnect is machined from the silicon substrate. The interconnect includes a spring body. The spring body includes at least two spring arms. Each spring arm includes a first end distal from a center of the interconnect, a second end proximate the center of the interconnect, and a single turn of a constant curvature. Each spring arm is configured to move rotationally in a plane parallel to the top surface of the silicon substrate.

On one embodiment, signal pedestals are positioned on the center of the interconnect. This provides signal conductivity to other electrical devices. Multiple connections to one interconnect also become possible.

According to an embodiment of the present disclosure, a quantum computing device is provided. The quantum computing device includes a pocket transmon qubit circuit. The quantum computing device also includes a microelectromechanical system device. The MEMS device includes: a silicon substrate, top surface of the silicon substrate, and an interconnect machined from the silicon substrate. The interconnect includes a spring body. The spring body includes at least two spring arms. Each spring arm includes a first end distal from a center of the interconnect, a second end proximate the center of the interconnect, and a single turn of a constant curvature. Each spring arm is configured to move rotationally in a plane parallel to the top surface of the silicon substrate.

In one embodiment, two or more landing pedestals on the silicon substrate are positioned distally from the center of the interconnect. The landing pedestals provide controlled separation of chip devices so that stacking within a small footprint becomes possible.

According to an embodiment of the present disclosure, a method of manufacturing a microelectromechanical system device is provided. The method includes controllably removing silicon from a silicon substrate, wherein one or more silicon features remain on the silicon substrate. The silicon substrate and the one or more silicon features are masked. Silicon is selectively removed from the silicon substrate based on a mask pattern defined by the masking step. The mask pattern defines an interconnect including a spring body. The spring body includes at least two spring arms. Each spring arm includes a first end distal from a center of the interconnect, a second end proximate the center of the interconnect, and a single turn of a constant curvature.

In one embodiment, each spring body defined by the mask pattern is shaped to spiral from the first distal end to the second proximate end. The spiral shape provides symmetry in the design and balanced deflection when a current is passed through the interconnect. The spiral shape allows the spring body to deflect and recoil in plane and out of plane.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIG. 14A is a diagrammatic view of a step in a process for fabricating a MEMS device, consistent with one or more illustrative embodiments.

FIG. 14B is a diagrammatic view of a final step in a process for fabricating a MEMS device, consistent with one or more illustrative embodiments.

FIG. 14C is a top view of a MEMS device result from the step shown in FIG. 14B according to an illustrative embodiment.

DETAILED DESCRIPTION

Overview

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Definitions

Transmon Qubit Circuit: a superconducting charge qubit used in superconducting quantum computing.

Referring to the Figures in general, embodiments disclose a quantum computing device. In an illustrative embodiment, the device includes a microelectromechanical system (MEMS) interconnect that is configured to operate in conjunction with a transmon qubit circuit. In some packages, the MEMS interconnect device and the qubit circuit are part of, or constitute, a chip device for quantum computing applications. As will be appreciated, features of the subject device are conducive to providing reliable connections in quantum computing circuits. Simulations have shown that a MEMS based interconnect of the subject technology may tolerate the required forces and motion to make a reliable connector. A MEMS based interconnect may have several advantages over either wire bond or bump bonds. Some advantages include durability during several mate and de-mate cycles, an inherent rotational scrubbing movement due to springs' curvature and connection, and a relatively small footprint compared to commercially available metal spring contacts.

Figure 1:
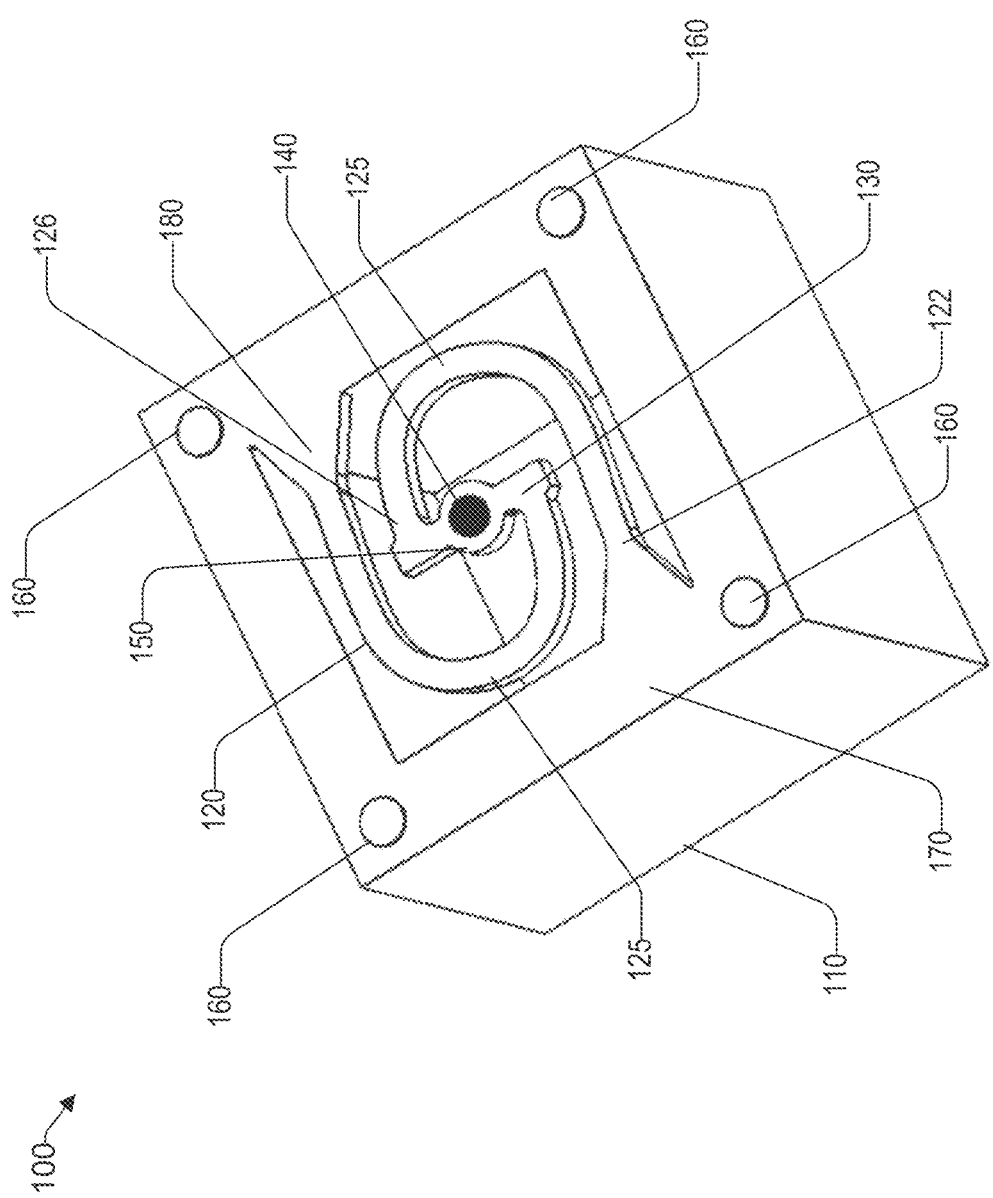
FIG. 1 is a top, perspective view of MEMS device with an interconnect according to an illustrative embodiment.

Referring now to FIG. 1, a MEMS interconnect device 100 (sometimes referred to as a "chip device 100") is shown according to an illustrative embodiment. The MEMS interconnect device 100 may be fabricated from a silicon substrate 110. In the illustrative embodiment shown, the silicon substrate is a hollow cube that may be conducive to stacking arrangements with other devices for establishing connections (See for example, FIG. 3). However, as will be seen in other embodiments below, the silicon structure may have a shorter profile. In general, the MEMS interconnect device 100 includes a spring body 120. The spring body 120 may generally be positioned on a top surface 170 of the silicon substrate 110. As will be described further below, the spring body 120 may be formed by etching (or other subtractive process) the silicon from the substrate 110. The spring body 120 includes two or more spring arms 125. The spring arm 125 includes a first end 122, distal from a center 150 of the interconnect and a second end 126, proximate the center 150 of the interconnect. In some embodiments, the spring arm 125 may include a constant width of silicon from the distal end 122 to the proximate end 126. For sake of illustration and to avoid clutter, only a single instance of each end 122 and 126 for a spring arm 125 has been called out.

In an illustrative embodiment, the spring arms 125 include a single turn (or curve) of a constant curvature. The spring arms 125 may be identical to each other and may be positioned symmetrically around the interconnect center 150. In some embodiments, the distal end 122 of a first spring arm 125 may be on an opposite side (opposite corner or diametrically opposite) of the silicon substrate top surface 170 from the distal end 122 of a second spring arm 125. In the embodiment shown in FIG. 1, the two spring arms 125 are connected to resemble a general 'S" shape. Some embodiments may include a flange 130 coupling the proximate end 126 to the interconnect center 150. The flange 130 may provide a leverage element that helps turn the spring body 120 around the interconnect center 150 (discussed immediately below). In some embodiments, the distal end 122 of the spring arm 125 has a second width that is wider than the constant width (for example, tapers down from the base of the distal end 122 to the spring arm 125). In the illustrative embodiment show, the distal end 122 may be triangular at its base 180 to help provide structural support where the spring arm 125 initially flexes or deflects from the top surface 170.

Some embodiments of the MEMS interconnect device 100 may include silicon features or conductive features. For example, one or more pedestals 140 may be fabricated on to the interconnect center 150 where spring arms 125 meet (are joined). The pedestal 140 may be used to make physical (and in some embodiments, electrical) contact with the opposing surface of another quantum computing chip device (See for example FIGS. 6 and 7 below). In some embodiments the pedestal 140 may be a silicon formed bump. In some embodiments, the pedestal 140 is or includes a metallic pad that provides a conductive signal pedestal or a grounding signal pedestal. The pedestal 140 may be a patterned metal layer, that carries signal along the side of spring arms 125 to a non-suspended portion of the device outside the spring body 120. As will be appreciated, the spring body 120 provides the pedestal(s) 140 leeway in the vertical direction when the MEMS interconnect device 100 is coupled to another chip device that may have for example, a connection point aligned with the pedestal(s) 140. In some embodiments, there may be a wire bond pad or bump bond pad outside the spring body 120 to carry the signal to other parts of the circuit. In some embodiments, the top surface 170 may include one or more pedestals 160. The pedestals 160 may be positioned at proximate corners of the top surface 170. The pedestals 160 may provide landing points for other devices 100 that may be stacked on top each other. The pedestals 160 provide spacing between stacked devices.

During an illustrative application, as a current is passed through the interconnect center 150, the opposing spring arms 125 cooperate to move rotationally around the center 150 in a plane parallel to the top surface 170. The current may cause each spring arm 125 to deflect so that the spring body 120 recoils in plane and out of plane.

Figure 2:
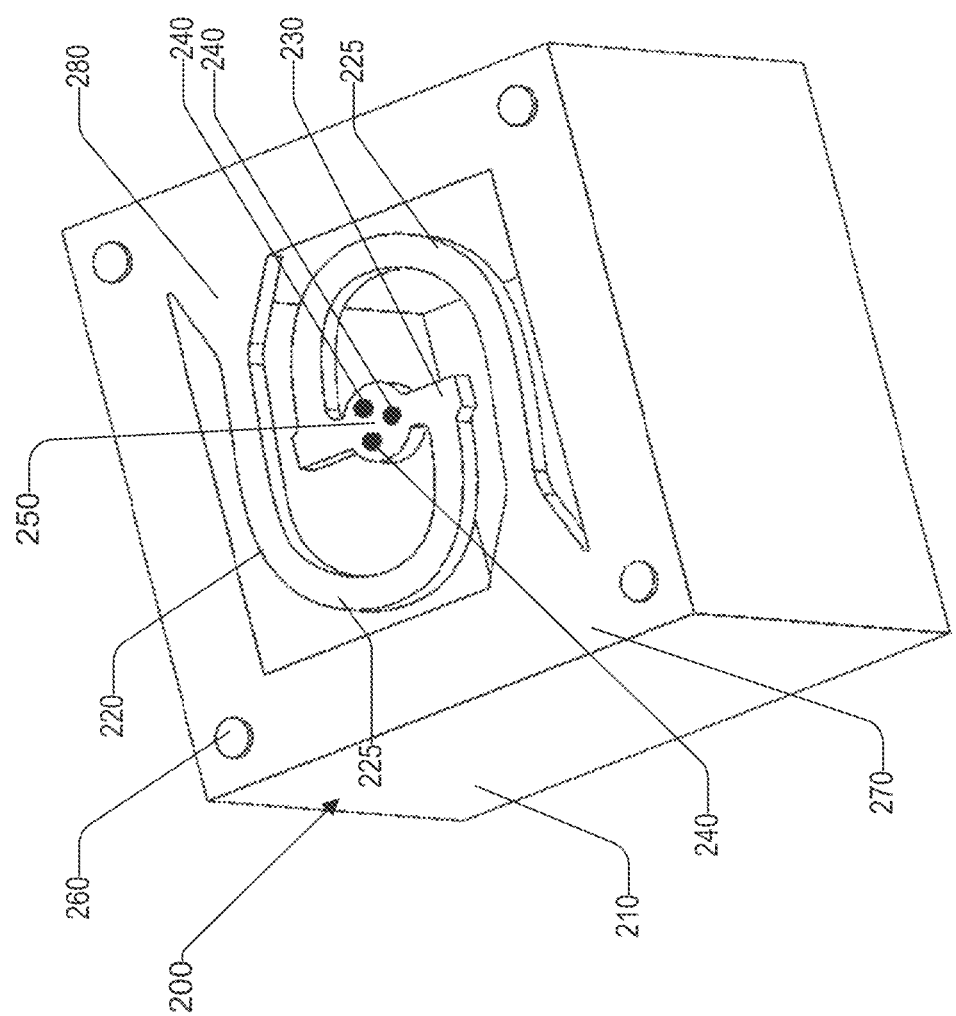
FIG. 2 is a top, perspective view of MEMS device with an interconnect according to another illustrative embodiment.

FIG. 2 shows a MEMS interconnect device 200 that is similar to the MEMS interconnect device 100 where like elements are numbered similarly to the reference numerals in FIG. 1 except that the reference numerals in FIG. 2 use the 200 series. In the embodiment shown in FIG. 2, the interconnect center 150 includes a plurality of pedestals 240 that may include or serve as different types of conductive pedestals in one device (for example, a mix of signal and grounding pedestals).

Figure 3:
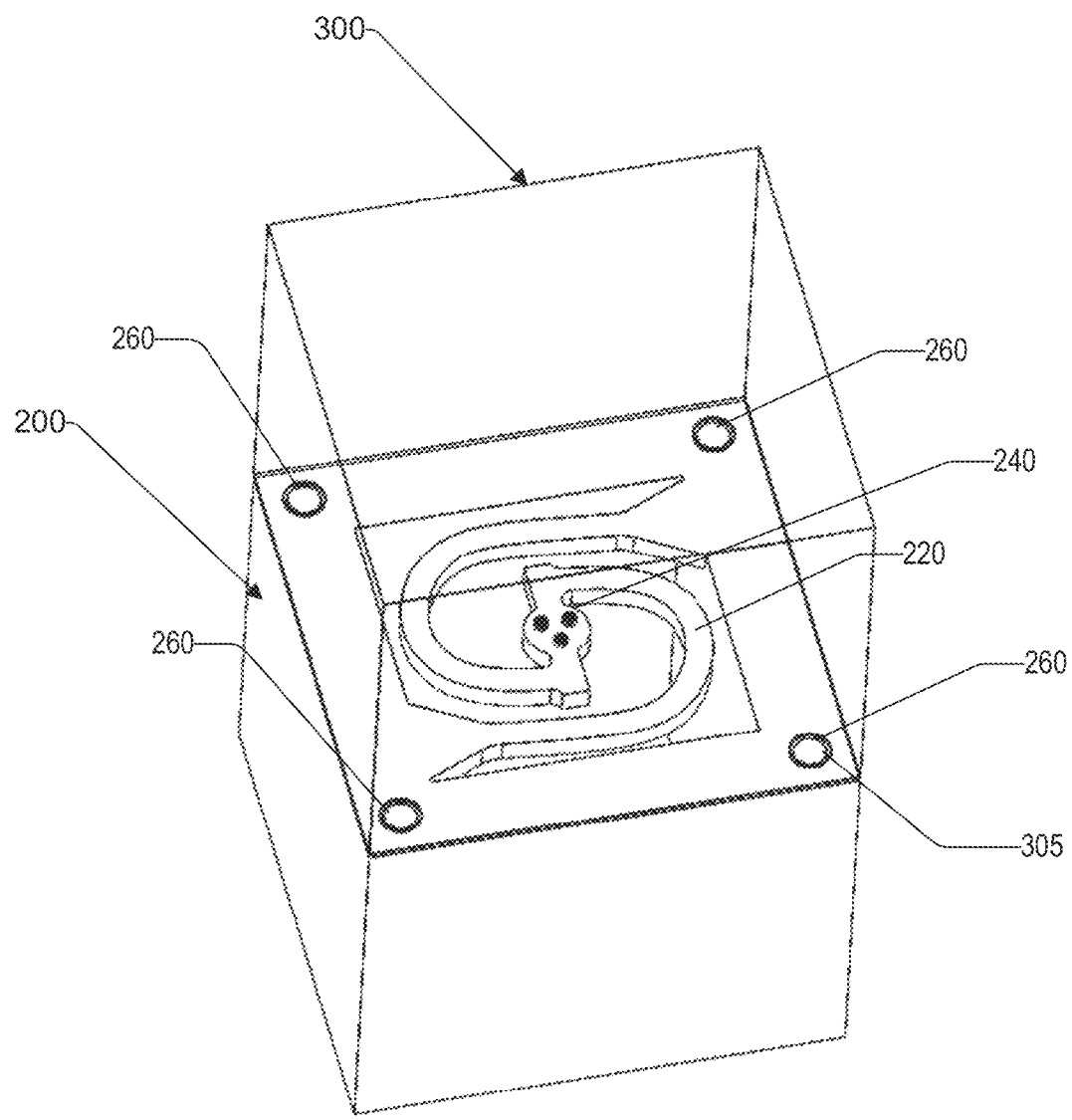
FIG. 3 is a top, perspective diagrammatic view of a MEMS device positioning scheme, consistent with an illustrative embodiment.

FIG. 3 shows an illustrative embodiment representing controlled chip separation between a device 200 and a device 300. The device 300 is shown in a transparent frame to represent any type of chip that may be mounted/stacked to a device of the subject technology. In one embodiment, landing pedestals 260 (4 shown) allow for controlled separation of chip device 200 and 300. In the embodiment illustrated, the landing pedestals 260 may be 10 μm tall, the signal pedestals 240 may be 10 μm tall, there may be 5 μm deep pockets 305 in the mating chip 300. If a capacitive/inductive connection is desired, one may place the coupler artwork (for example, the design defining the solid and etched sections of the resultant silicon device), on the main wafer plane (of the wafer fabricated to manufacture chips under the subject technology) and then use the pedestals 240 to control the distance to the mating chip. For capacitive/inductive connections, the pedestals 240 may be dielectric spacing pedestals.

Figure 4:
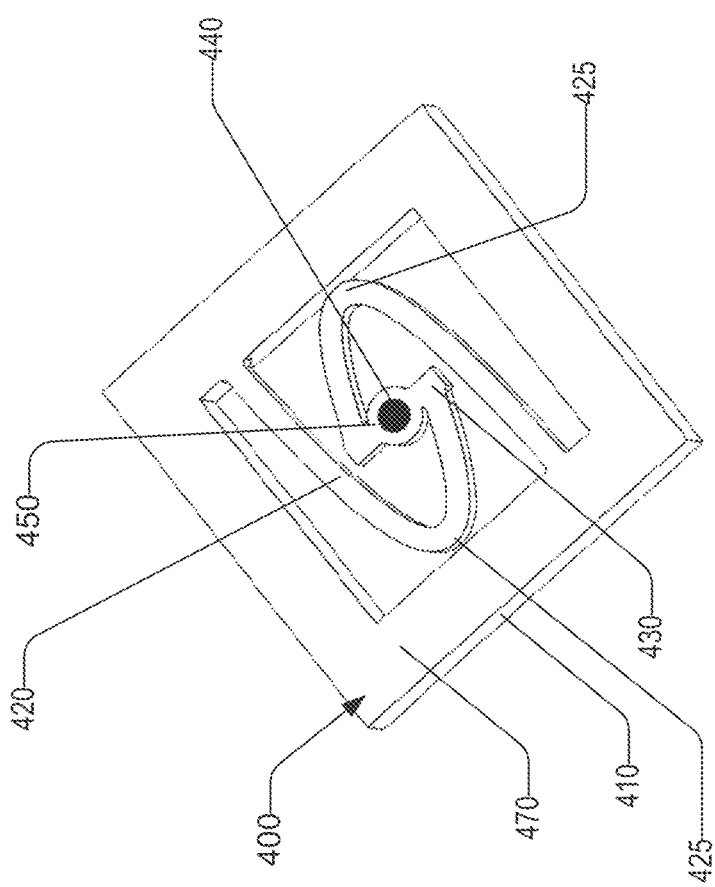
FIG. 4 is a top, perspective view of MEMS device with an interconnect according to another illustrative embodiment.

FIG. 4 shows a MEMS interconnect device 400 that is similar to the MEMS interconnect device 100, except that the silicon substrate 410 is lower in profile than the silicon substrate 110. In this embodiment, elements analogous to the same features in FIG. 1 are called out in the 400 series.

Figure 5:
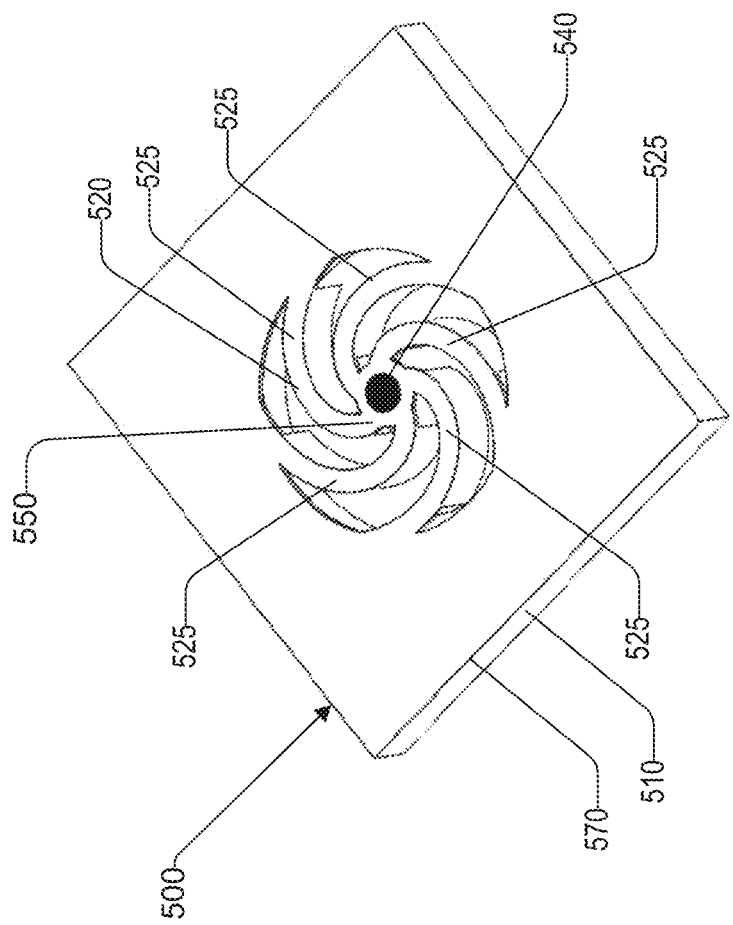
FIG. 5 is a top, perspective view of MEMS device with an interconnect according to another illustrative embodiment.

FIG. 5 shows a MEMS interconnect device 500 that is similar to the MEMS interconnect device 400, except that the spring bodies 520 are shaped differently. In this embodiment, elements analogous to the same features in FIGS. 1 and 4 are called out in the 500 series. There are five spring arms 525 shown. Each spring arm 525 is a spiral that emanates from a circular opening in the silicon substrate 510 and continues inward to the interconnect center 550. As may be appreciated, the symmetry of spring arms 525 is still provided and the rotational deflection around the interconnect center 550 is maintained even with an odd number of spring arms 525.

Figure 6:
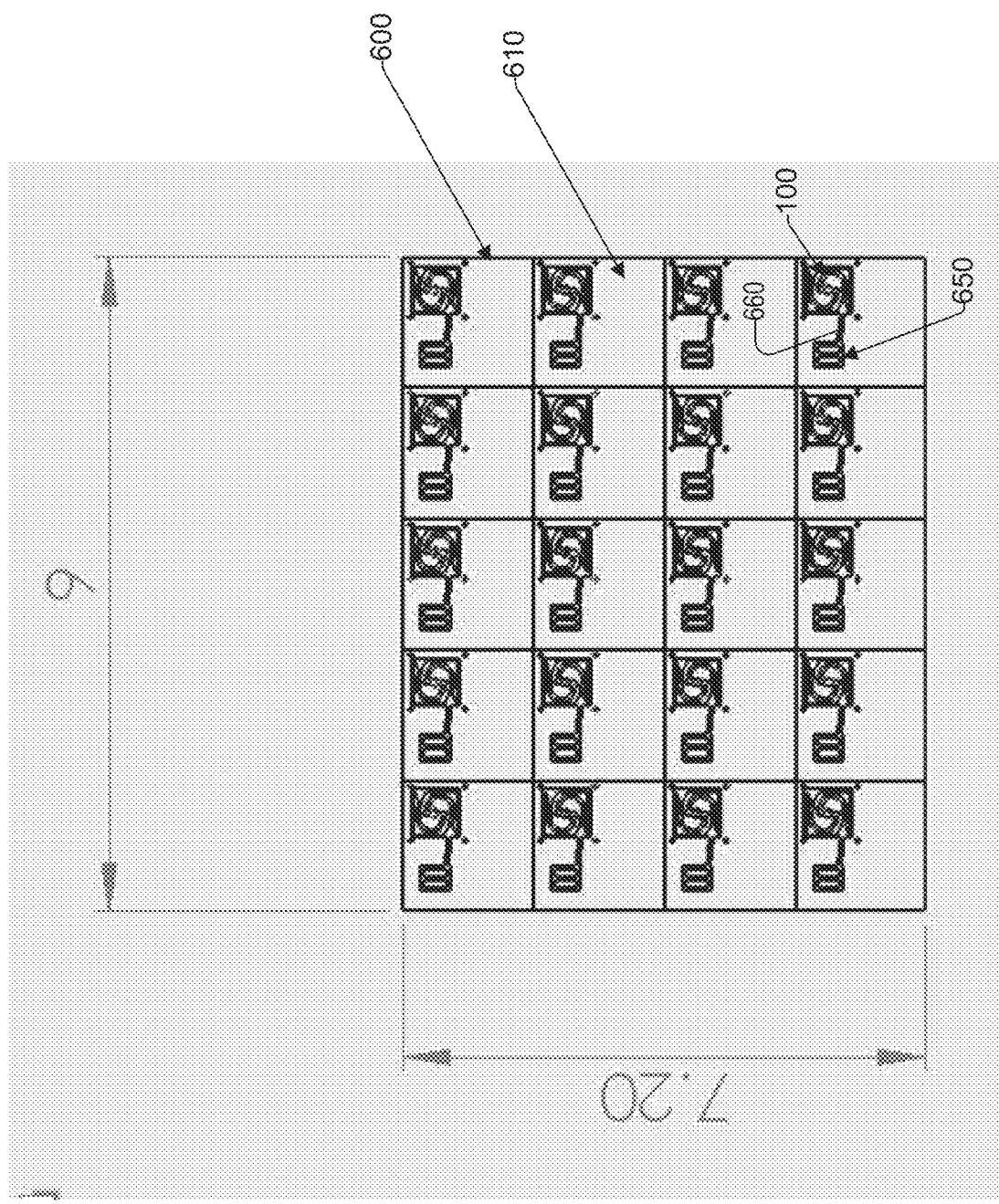
FIG. 6 is a top, diagrammatic view of a quantum computing device array, consistent with an illustrative embodiment.
Figure 7:
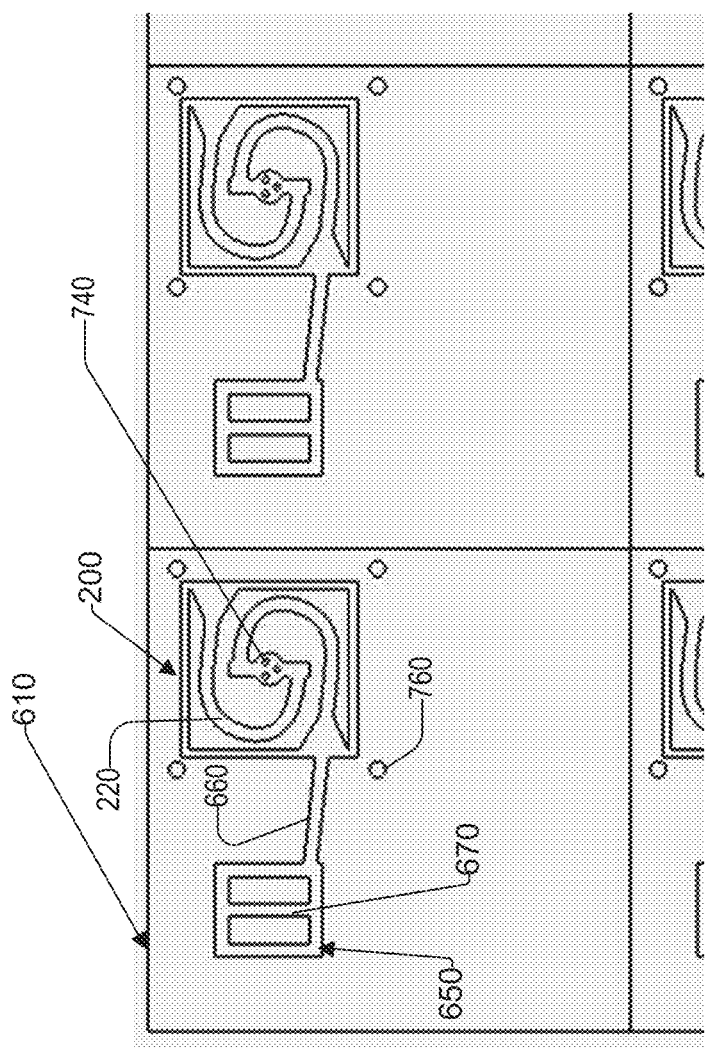
FIG. 7 is an enlarged top, diagrammatic view of two quantum computing devices in the array of FIG. 6, consistent with an illustrative embodiment.

Referring now to FIGS. 6 and 7, an array 600 of quantum computing chip devices 610 are shown in an illustrative embodiment. The chip devices 610 are shown in a single layer, however it will be understood that embodiments may stack arrays 600 on top of other arrays 600 using the controlled chip separation schemes described above. In one illustrative embodiment, a chip device 610 includes a MEMS interconnect device 100 connected to a transmon qubit circuit 650. The transmon qubit circuit 650 may include a pocket region 670. A conductive trace 660 may connect the MEMS interconnect device 100 connected to the transmon qubit circuit 650. A 4×5 array of devices 610 may be 7.2 mm wide×9 mm tall on a 720 um thick substrate. In FIG. 7, an embodiment using a MEMS interconnect device 200 is shown that includes dielectric spacing pedestals 740 and landing pedestals 760 in the corners of the substrate to provide controlled chip spacing in the vertical direction for stacked arrays 600.

Figure 8:
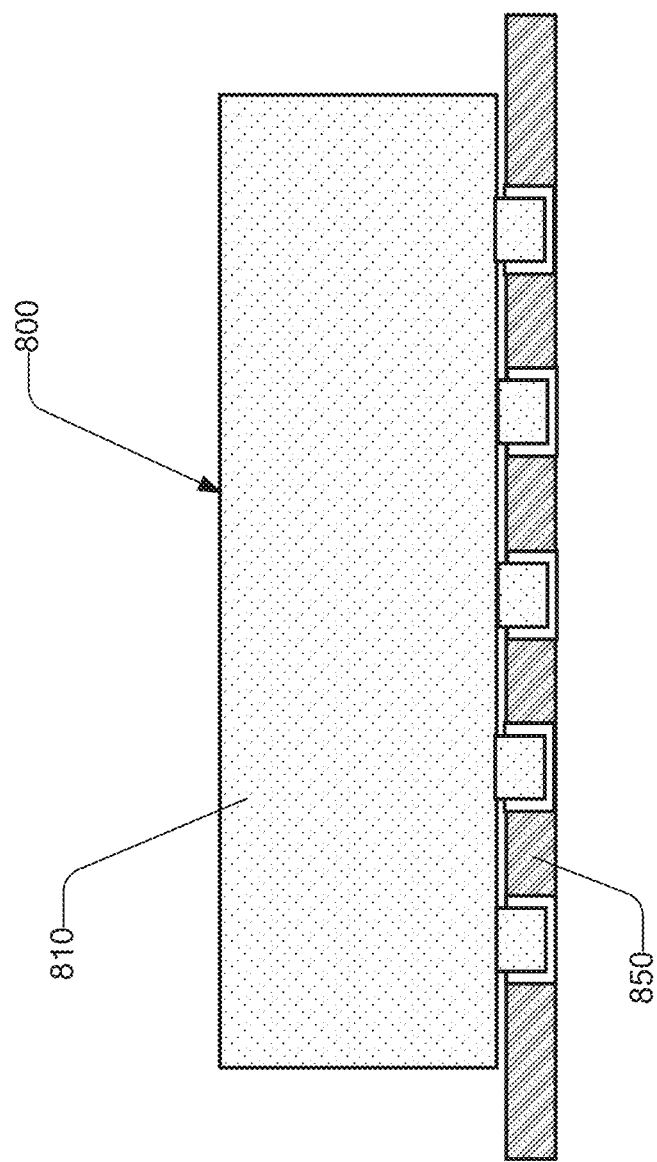
FIG. 8 is a block diagram of a side contact connector, consistent with one or more illustrative embodiments.
Figure 9:
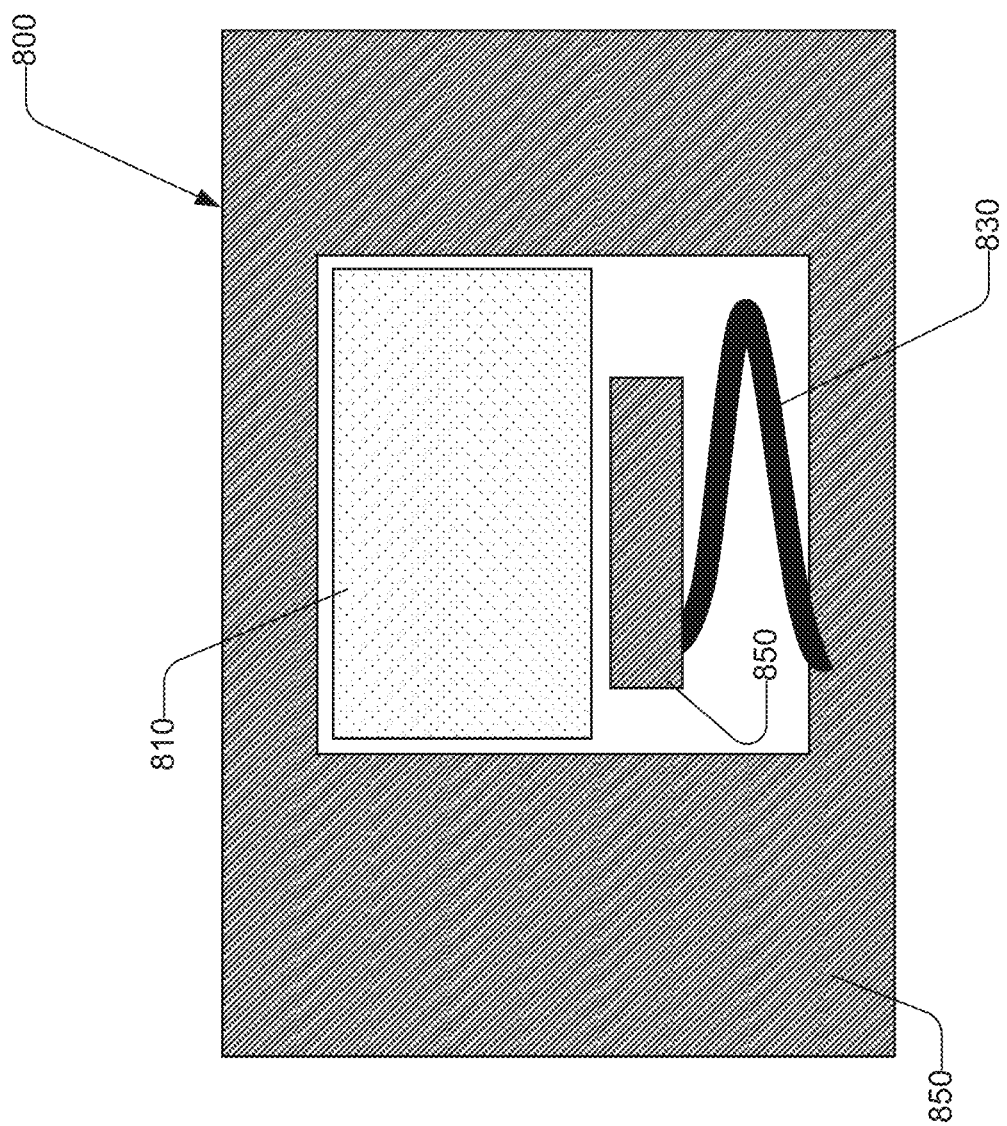
FIG. 9 is a top view of the side contact connector of FIG. 8.

Referring now to FIGS. 8 and 9, a contact connector 800 is shown according to an illustrative embodiment. The contact connector 800 may be configured for side contact. For example, a mating chip 810 may be configured to allow for a sliding edge galvanic, capacitive or inductive coupling to silicon substrate 850. FIG. 9 further shows a cantilever spring 830 that provides support to the rigidity of the silicon substrate 850.

Referring now to FIGS. 10-13, 14A, 14B, and 14C, a process for fabricating a MEMS interconnect device 200 is shown according to an illustrative embodiment. The process is shown in stages of fabrication. It will be understood that for sake of illustration, while the drawings show different stages of fabrication, there may be some embodiments with intermediate steps not shown herein but are contemplated within the scope of the subject process.

Figure 10:
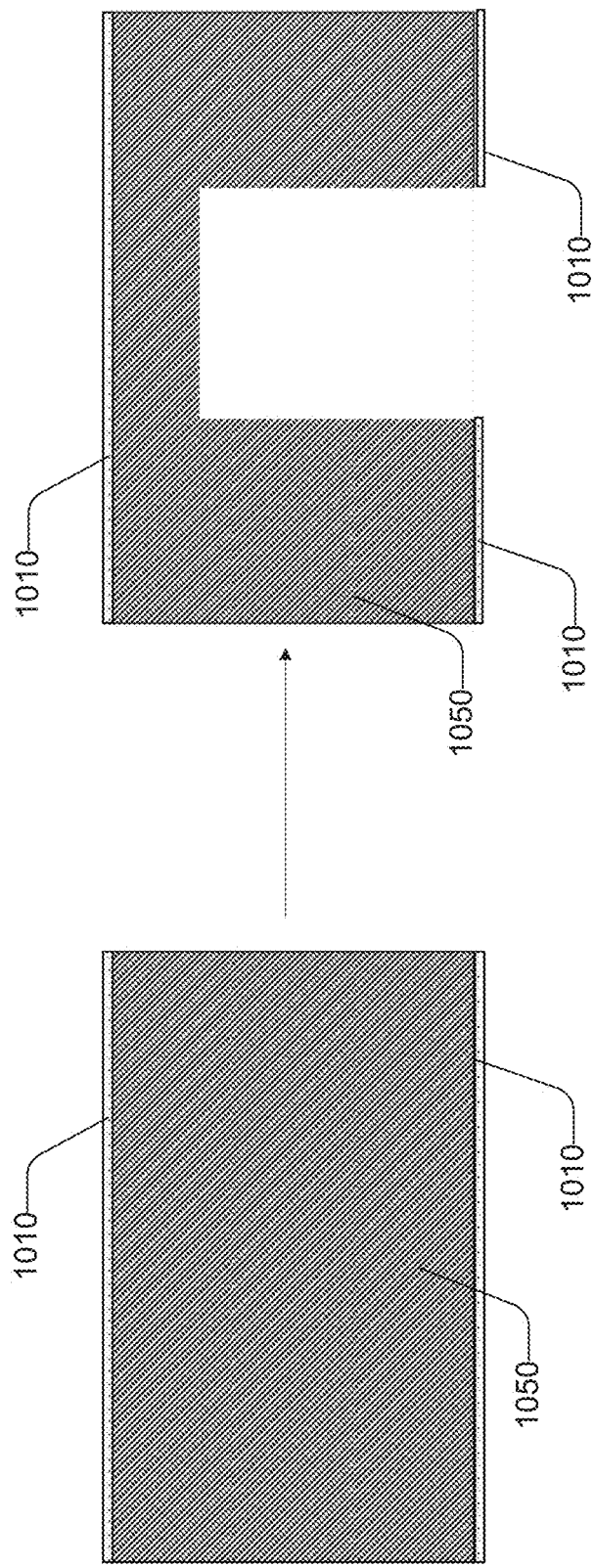
FIG. 10 is a diagrammatic view of a step in a process for fabricating a MEMS device according to another illustrative embodiment.

In FIG. 10, a layer of thermal oxide 1010 may be grown onto both sides of a silicon substrate 1050 (for example, a double sided polished silicon wafer). In some embodiments, a section of the thermal oxide layer 1010 and a section of the silicon substrate 1050 may be etched away leaving for example, a hollow interior volume of the silicon.

Figure 11:
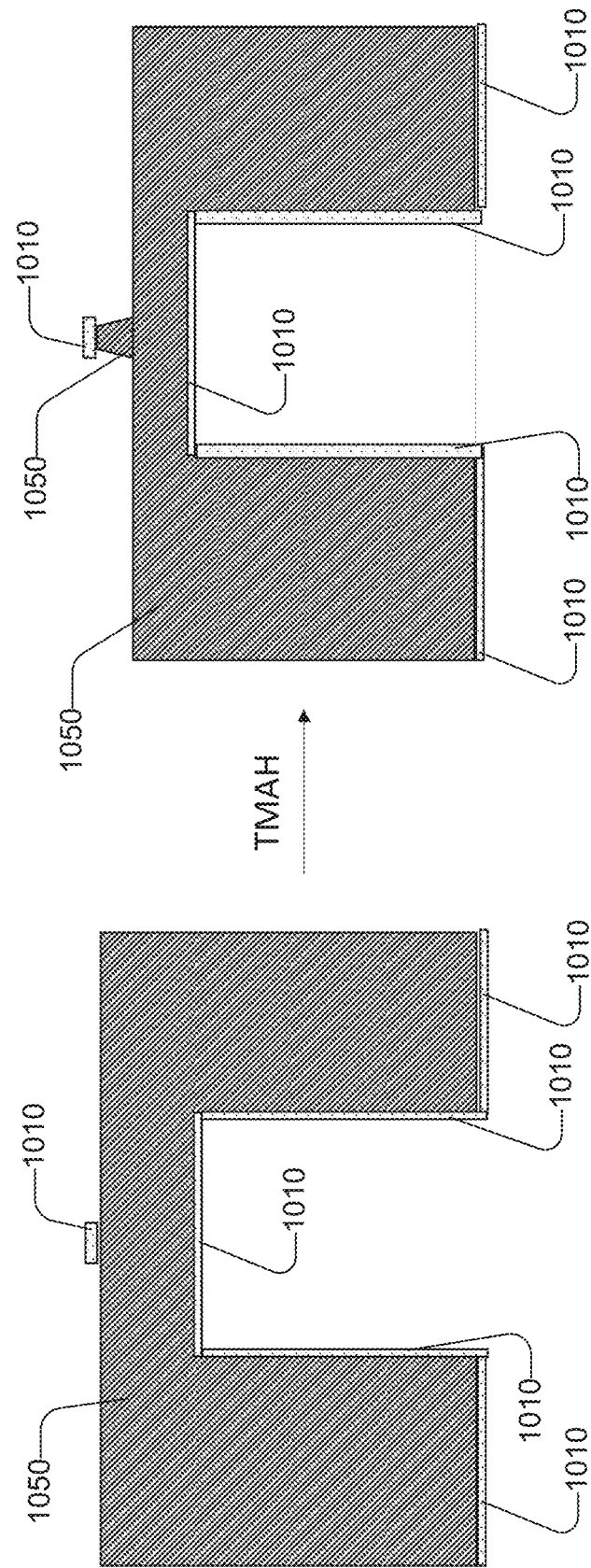
FIG. 11 is a diagrammatic view of a step in a process for fabricating a MEMS device, consistent with one or more illustrative embodiments.

FIG. 11 shows steps that include depositing a layer of thermal oxide 1010 onto the bottom side of the silicon substrate 1050. The remaining thermal oxide 1010 on the top side may be patterned (dry or wet etch) to leave a small square hard mask for silicon. Exposed silicon may be etched with for example, Tetramethylammonium hydroxide (TMAH), which makes pyramid shaped side walls around the hard mask. An example of a silicon bump is shown in the center covered by thermal oxide 1010 after silicon was removed around the bump.

Figure 12:
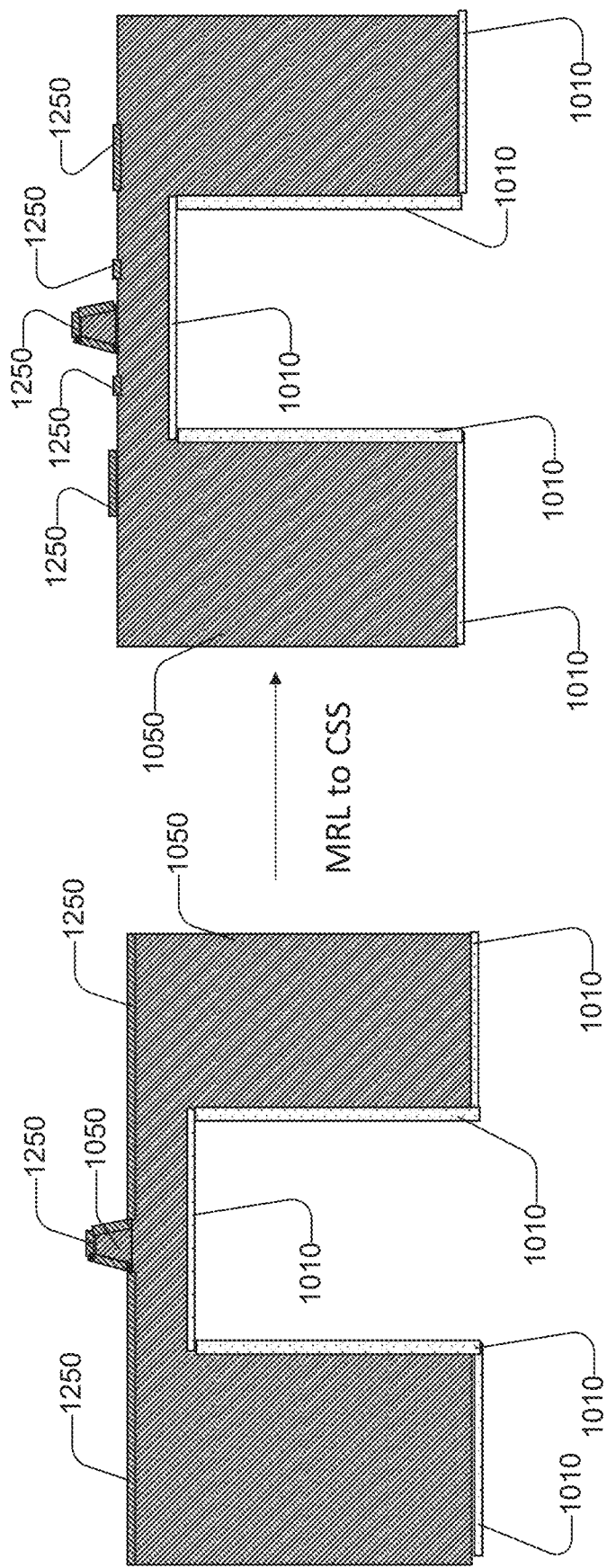
FIG. 12 is a diagrammatic view of a step in a process for fabricating a MEMS device consistent with one or more illustrative embodiments.

FIG. 12 shows steps that includes depositing a layer of metal 1250 (for example, by sputtering aluminum) on the top side of the silicon substrate and over one or more of the silicon features that were patterned out in the previous steps. The layer of metal 1250 may be etched according to a pattern.

Figure 13:
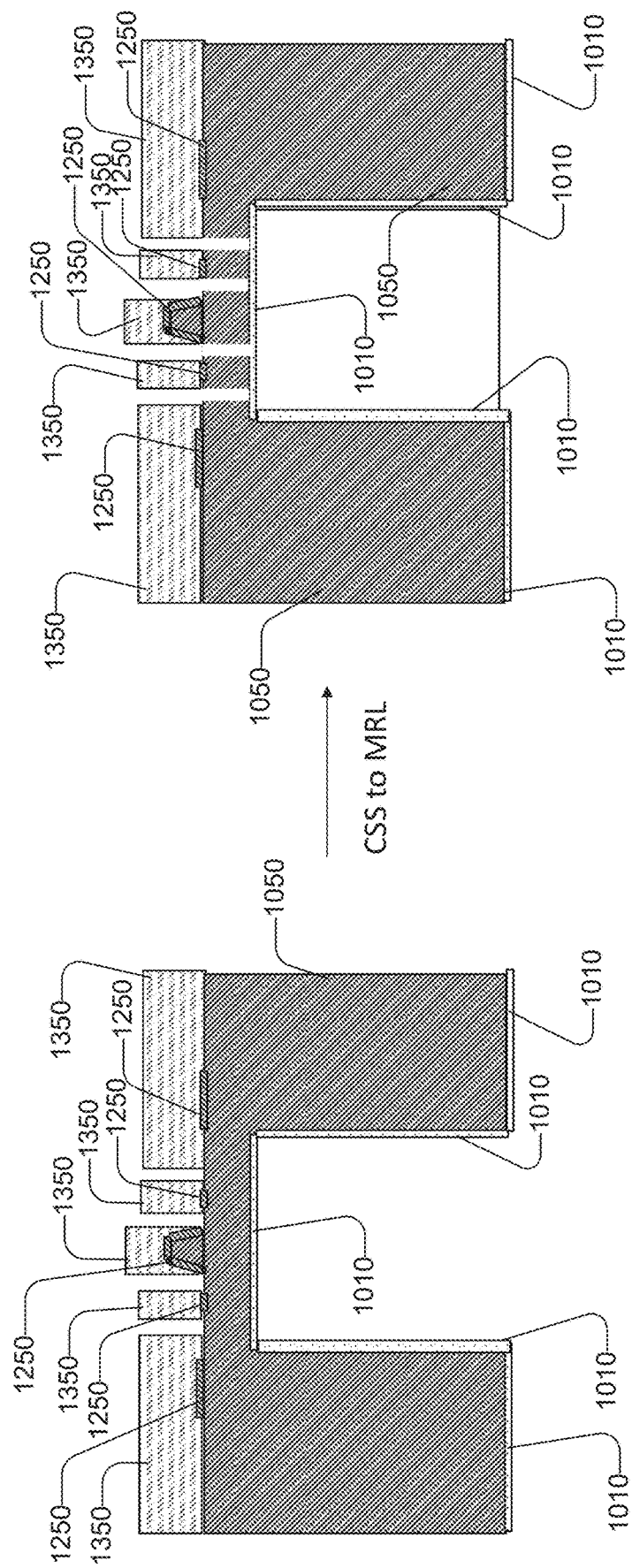
FIG. 13 is a diagrammatic view of a step in a process for fabricating a MEMS device, consistent with one or more illustrative embodiments.

FIG. 13 shows steps that include depositing a laminate film pattern 1350 over the top side of the silicon substrate 1050 and over features on the top side or sections of the silicon that are to remain. Silicon that is not covered by the laminate film pattern 1350 is removed by an etching process. The result in FIG. 13 is repeated in FIG. 14A for comparison to the final results shown in FIGS. 14B and 14C.

FIGS. 14B and 14C show the result of removing the thermal oxide layer 1010 on the bottom side of the wafer and removing the laminate film pattern 1350 on the top side. What remains is the silicon substrate 1050 and metal layer 1250 that form the MEMS interconnect device 200 (or other embodiment described above depending on the masking and metal deposition steps).

Figure 15:
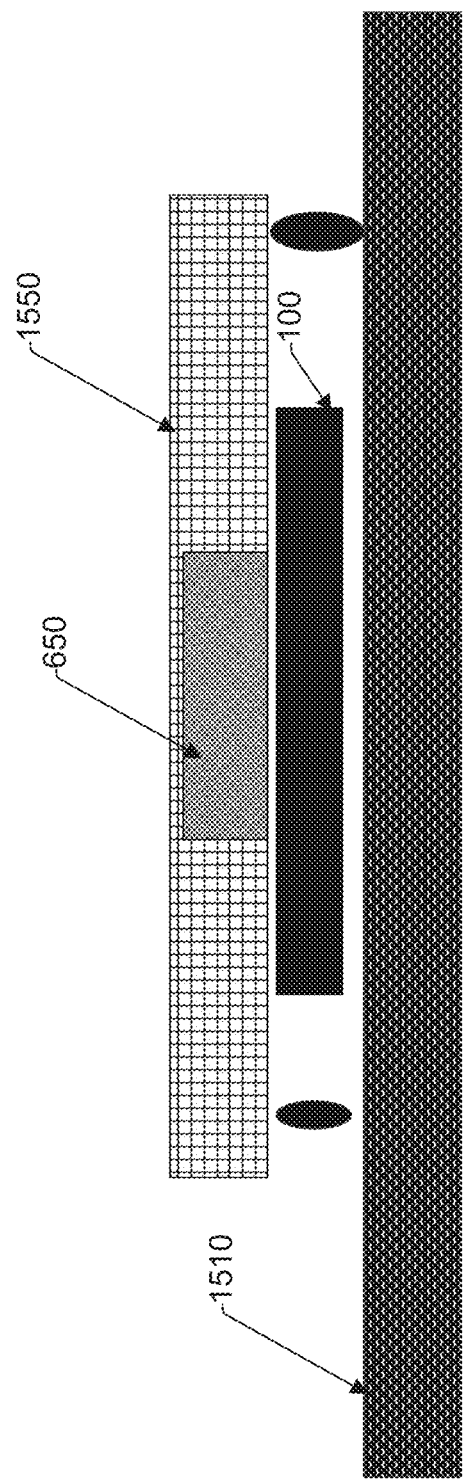
FIG. 15 is a block diagram of a qubit based device according to an illustrative embodiment.

Referring now to FIG. 15, an illustrative embodiment showing one example of integrating a MEMS interconnect device 100 and qubit chip 650 with an interposer layer 1550 is disclosed. By machining or etching a hole through the interposer layer 1550, a dock can be made for the qubit chip 650 to be set into. The MEMS interconnect device 100 may be used to connect the traces on the interposer layer 1550 to the qubit chip 650. In some embodiments, the arrangement of the MEMS interconnect device 100, the qubit chip 650, and the interposer layer 1550 may be supported by a printed circuit board (PCB) or laminate layer 1510.

Figure 16:
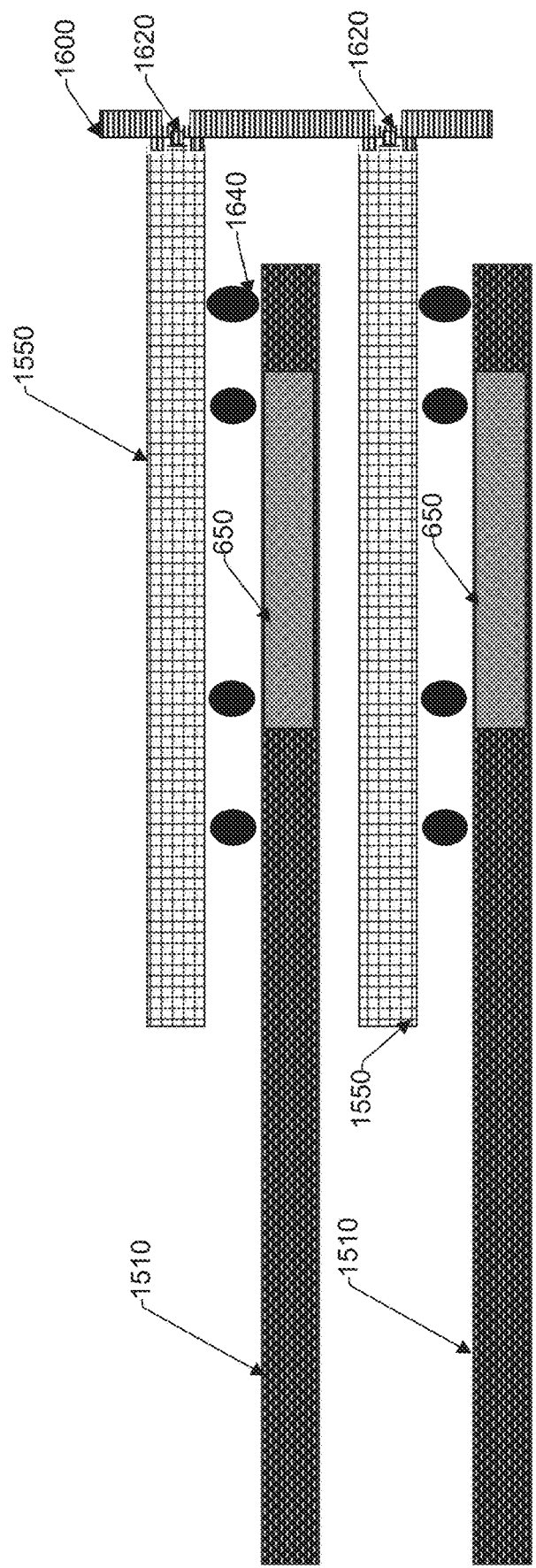
FIG. 16 is a block diagram of a modular, qubit based system according to an illustrative embodiment.

FIG. 16 shows an illustrative embodiment that provides modularization of layers using the subject technology. In one embodiment, a MEMS interconnect device 1600 (which is similar to the MEMS interconnect device 100 and its variations) couples to multiple interposer layers 1550 by connection to the spring bodies 1620. Electrical connections between the interposer layers 1550 and the qubit chips 650 and PCB 1510 may be provided through vias 1640. As can be seen, one module comprising the interposer layer 1550, the qubit chip 650, and the PCB 1510 may have scalable communication access to one or more other similar modules through the MEMS interconnect device 1600 which may be configured to provide a conductive pathway to different modules in some embodiments.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A microelectromechanical system (MEMS) device, comprising:
    a silicon substrate having a top surface;
    an interconnect machined from the silicon substrate, wherein:
        the interconnect includes a spring body,
        the spring body includes two or more spring arms, wherein each spring arm includes:
            a first end distal from a center of the interconnect;
            a second end proximate the center of the interconnect; and
    one or more silicon bumps on the center of the interconnect configured to make vertical physical contact with a connection point on another device, wherein the spring body is configured to provide vertical leeway in a direction of the physical contact.

2. The device of claim 1, wherein the one or more silicon bumps are signal pedestals including a metallic surface for conducting an electrical signal.

3. The device of claim 2, wherein the one or more signal pedestals include at least one ground pedestal.

4. The device of claim 1, further comprising two or more landing pedestals on the silicon substrate positioned distally from the center of the interconnect.

5. The device of claim 4, wherein the two or more landing pedestals are positioned adjacent corners of the silicon substrate.

6. The device of claim 1, wherein the spring body is configured to move rotationally in a plane parallel to the top surface of the silicon substrate.

7. The device of claim 1, wherein each distal end of each spring arm includes a second width that is wider than the constant width.

8. The device of claim 1, further comprising a flange connecting the second proximate end to the center of the interconnect.

9. The device of claim 1, wherein the first distal end of a first spring arm is on an opposite side of the silicon substrate from the first distal end of a second spring arm.

10. The device of claim 1, wherein each spring arm is configured to spiral from the first distal end to the second proximate end.

11. A quantum computing device, comprising:
    a transmon qubit circuit; and
    a microelectromechanical system (MEMS) device, including:
        a silicon substrate having a top surface;
        an interconnect machined from the silicon substrate, wherein the interconnect includes a spring body,
        the spring body includes two or more spring arms, wherein each spring arm includes:

a first end distal from a center of the interconnect;

a second end proximate the center of the interconnect; and one or more silicon bumps on the center of the interconnect configured to make vertical physical contact with a connection point on another device, wherein the spring body is configured to provide vertical leeway in a direction of the physical contact.

12. The device of claim 11, wherein the one or more silicon bumps are signal pedestals including a metallic surface for conducting an electrical signal.

13. The device of claim 12, wherein the one or more signal pedestals include at least one ground pedestal.

14. The device of claim 11, further comprising two or more landing pedestals on the silicon substrate positioned distally from the center of the interconnect.

15. The device of claim 14, wherein the two or more landing pedestals are positioned adjacent corners of the silicon substrate.

16. The device of claim 11, wherein the spring body is configured to move rotationally in a plane parallel to the top surface of the silicon substrate.

17. The device of claim 11, wherein each spring arm is configured to spiral from the first distal end to the second proximate end.

18. A method of manufacturing a microelectromechanical system (MEMS) device, comprising:
    controllably removing silicon from a silicon substrate, wherein one or more silicon features remain on the silicon substrate;
    masking the silicon substrate and the one or more silicon features; and
    selectively removing silicon from the silicon substrate based on a mask pattern defined by the masking step, wherein:
        the mask pattern defines an interconnect including a spring body wherein the spring body includes at least two spring arms; and
        each spring arm includes a first end distal from a center of the interconnect, a second end proximate the center of the interconnect, and one or more silicon bumps on the center of the interconnect configured to make vertical physical contact with a connection point on another device, wherein the spring body is configured to provide vertical leeway in a direction of the physical contact.

19. The method of claim 18, wherein the one or more silicon features include a signal pedestal, a ground pedestal, or a landing pedestal.

20. The semiconductor package of claim 19, wherein two or more of the landing pedestals on the silicon substrate are positioned distally from the center of the interconnect adjacent corners of the silicon substrate.

* * * * *